(12) United States Patent
Mieno

(10) Patent No.: US 9,257,538 B2
(45) Date of Patent: Feb. 9, 2016

(54) FIN-TYPE FIELD EFFECT TRANSISTOR AND MANUFACTURING METHOD THEREOF

(71) Applicant: SEMICONDUCTOR MANUFACTURING INTERNATIONAL (SHANGHAI) CORPORATION, Shanghai (CN)

(72) Inventor: Fumitake Mieno, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/503,348

(22) Filed: Sep. 30, 2014

(65) Prior Publication Data

US 2015/0102393 A1    Apr. 16, 2015

(30) Foreign Application Priority Data

Oct. 14, 2013    (CN) .......................... 2013 1 0479801

(51) Int. Cl.
*H01L 21/283*    (2006.01)
*H01L 29/78*    (2006.01)
*H01L 29/66*    (2006.01)

(52) U.S. Cl.
CPC ........ *H01L 29/66795* (2013.01); *H01L 21/283* (2013.01); *H01L 29/785* (2013.01); *H01L 29/7848* (2013.01)

(58) Field of Classification Search
CPC .................................................... H01L 21/283

USPC ..................... 438/41, 44, 300, 413, 429, 607; 257/623, E21.619
See application file for complete search history.

(56) References Cited

U.S. PATENT DOCUMENTS

| 2014/0264636 | A1* | 9/2014 | Tsai | .................. H01L 29/66636 257/408 |
| 2015/0035017 | A1* | 2/2015 | Wann | ..................... H01L 29/785 257/288 |
| 2015/0041855 | A1* | 2/2015 | Liao | .................. H01L 29/41791 257/192 |
| 2015/0102393 | A1* | 4/2015 | Mieno | ............... H01L 29/66795 257/288 |
| 2015/0236132 | A1* | 8/2015 | Chang | ............... H01L 29/66795 257/288 |

* cited by examiner

*Primary Examiner* — Earl Taylor
(74) *Attorney, Agent, or Firm* — Kilpatrick Townsend & Stockton LLP

(57) ABSTRACT

A FinFET device includes a gate dielectric layer on a substrate, a fin on the gate dielectric layer having a middle section and source and drain regions at opposite ends, and a gate structure on the middle section of the fin. The FinFET device also includes a trench in a portion of the source and drain regions and a multi-layered epitaxial structure in the trench. The multi-layered epitaxial structure includes a first epitaxial layer in direct contact with the bottom of the trench, a second epitaxial layer on the first epitaxial layer, and a third epitaxial layer on the second epitaxial layer. The first epitaxial layer is a carbon-doped silicon layer having a carbon dopant concentration of less than 4 percent by weight, the second epitaxial layer is a barrier metal layer, and the third epitaxial layer is a metal layer.

17 Claims, 4 Drawing Sheets

FIN-TYPE FIELD EFFECT TRANSISTOR AND MANUFACTURING METHOD THEREOF

CROSS-REFERENCES TO RELATED APPLICATIONS

This application claims priority to Chinese patent application No. 201310479801.6, filed on Oct. 14, 2013, the content of which is incorporated herein by reference in its entirety.

BACKGROUND OF THE INVENTION

The present invention relates to semiconductor devices, and more particularly to semiconductor devices having a fin structure and a method of manufacturing the same.

As the size of semiconductor devices is steadily scaled down, the performance of semiconductor devices is continuously improved. From a structural point of view, single-gate transistors have been replaced by multi-gate transistors. Fin field-effect transistors (FinFETs) are widely used in integrated circuits for their increased gate widths over planar transistors.

FIG. 1 is a perspective view of a fin field effect transistor (FinFET). As shown in FIG. 1 for illustrative purposes, the FinFET includes a semiconductor substrate 10', a fin structure (alternatively referred to as "fin") 14' disposed on substrate 10', a dielectric layer 11' covering substrate 10' and a portion of side surfaces of fin structure 14', and a gate structure disposed across fin structure 14'. The gate structure includes a gate electrode 12' and spacers 13' disposed on opposite sides of gate electrode 12'.

Similar to a planar transistor, the source/drain regions in fin structure 14' may be formed adjacent the gate electrode. However, since the fin structure of the FinFET is typically narrow, current crowding may occur. In addition, it is difficult to place contact plugs onto the source/drain regions of the fin structure. Epitaxial layers are thus formed on the fin structure to increase the volume of the fin structure using epitaxial growth processes.

Epitaxial growth processes have drawbacks. FIG. 2 is a cross-sectional view of an epitaxial layer grown from the semiconductor fin along the vertical direction of the line A-A' of FIG. 1. Referring to FIG. 2, an epitaxial layer 22' is grown on the source and drain regions in the fin structure 14'. Compared with a conventional planar transistor, the volumes of source/drain regions are not confined by shallow trench isolation (STI) and can be adjusted according to semiconductor device design requirements. However, because epitaxial layer 22' is typically formed of pure silicon, and the growth rate of the epitaxial layer is smaller on the (111) crystal plane than on other crystal planes, epitaxial layer 22' may extend laterally and form multiple facets 8' having substantially a rectangular profile or shape, whose corners reduce the air gap (lateral distance) between epitaxial layers grown from adjacent fins structures. Further, since the lateral distance between the grown epitaxial layers of adjacent fin structures can be reduced excessively, voids 30' will be undesirably formed when the laterally growing epitaxial layers of adjacent fin structures 14' merge together, as shown in FIG. 3.

BRIEF SUMMARY OF THE INVENTION

Embodiments of the present invention provide a fin-type field effect transistor and a method of manufacturing the same to solve the problems of conventional art, which excessively reduce the lateral distance due to the grown epitaxial layers having a rectangular (or substantially rectangular) profile (shape).

According to an embodiment, a method of manufacturing a fin-type field effect transistor includes providing a substrate having a fin formed thereon, forming a gate structure on the middle section of the fin, and forming source and drain regions at opposite ends of the fin. The method also includes etching the source and drain regions to form a trench, forming a first epitaxial layer in the trench, forming a second epitaxial layer on the first epitaxial layer, and forming a third epitaxial layer on the second epitaxial layer. The first epitaxial layer is a carbon-doped silicon layer having a carbon concentration of less than about 4 percent by weight. The second epitaxial layer is a barrier metal layer, and the third epitaxial layer is a metal layer.

According to another embodiment, a FinFET device includes a gate dielectric layer disposed on a substrate, a fin on the gate dielectric layer having a middle section and source and drain regions at opposite ends, and a gate structure on the middle section of the fin. The FinFET device also includes a trench in the source and drain regions and an epitaxial layer including a first epitaxial layer in the trench, a second epitaxial layer on the first epitaxial layer, and a third epitaxial layer on the second epitaxial layer. The first epitaxial layer is a carbon-doped silicon layer having a carbon concentration of less than about 4 percent by weight, the second epitaxial layer is a barrier metal layer, and the third epitaxial layer is a metal layer.

According to embodiments of the present invention, the fin structure has a trench in the source and drain regions that is in direct contact with the first epitaxial layer having a relatively low carbon concentration (less than 4 percent in weight), and because the second epitaxial layer disposed on the first epitaxial layer is a barrier metal layer, and a metal layer is disposed on the barrier metal layer, so that the epitaxial layer growth process will not form multiple facets having corners as in the prior art. Corners formed from facets may reduce the air gap (distance) between adjacent epitaxial layers resulting in the growing together of the adjacent epitaxial layers and formation of voids in the prior art. The epitaxial layer of the fin according to the present invention does not have facets forming a substantially rectangular profile, so that the air gap (lateral distance) between adjacent epitaxial layers is not reduced due to the absence of the corners of the substantially rectangular profile.

The following description, together with the accompanying drawings, will provide a better understanding of the nature and advantages of the claimed invention.

DETAILED DESCRIPTION OF THE INVENTION

It should be understood that the drawings are not drawn to scale, and similar reference numbers are used for representing similar elements. As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any possible combinations of one or more of the associated listed items.

The terms "horizontal" or "transverse" as used in this application are defined as a plane parallel to the conventional plane or surface of a wafer or substrate, regardless of the orientation of the water or substrate. The term "vertical" refers to a direction perpendicular to the horizontal as defined above. Prepositions, such as "on", "side" (as in "sidewall"), "below", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

The present invention will now be described more fully hereinafter with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

Figure 4:
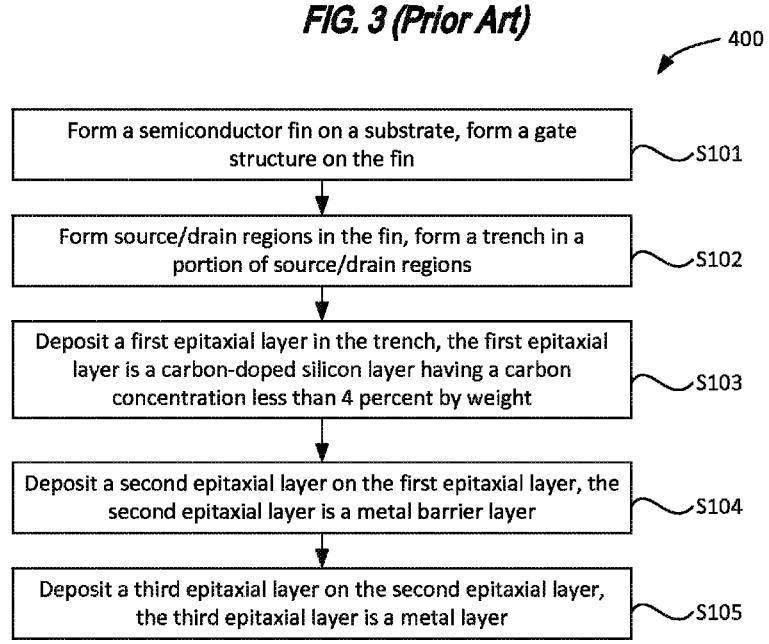
FIG. 4 is a flow chart of a method of manufacturing a fin-type semiconductor device according to an embodiment of the invention.

FIG. 4 is a flow chart of a method 400 of manufacturing a fin-type semiconductor device according to an embodiment of the invention. Method 400 includes providing a semiconductor substrate, forming a fin structure on the substrate, and forming a gate structure on the fin structure at S101. Method also includes forming source/drain regions in the fin structure and etching the source/drain regions to form a trench in a portion of the source/drain regions at S102. Method 400 further includes depositing a first epitaxial layer in the trench of the source/drain regions at S103. The first epitaxial layer is a silicon layer doped with carbon having a carbon concentration of less than 4 percent by weight. Method further includes depositing a second epitaxial layer on the first epitaxial layer at S104 and depositing a third epitaxial layer on the second epitaxial layer at S105. As would be appreciated by those skilled in the art, each of the steps or stages in the flowchart of FIG. 4 may encompass one or more separate steps and/or operations. Accordingly, the recitation of only five steps in S101-S105 should not be understood to limit the method of the present invention to five steps or stages. Moreover, each representative step or stage S101-S105 should not be understood to be limited to only a single process or the described processes.

In an embodiment, the second epitaxial layer is a metal barrier layer, and the third epitaxial layer is a metal layer. According to example embodiments of the present invention, the epitaxial layers is different from conventional epitaxial layers. The first epitaxial layer is a carbon-doped silicon layer having a carbon concentration of less than about 4 percent by weight, the second epitaxial layer is a metal barrier layer, and the third epitaxial layer is a metal layer. Because a trench is formed in the source/drain regions of the fin structure and filled with the first, second, and third epitaxial layers, the epitaxial layers may effectively enhance stress on the trench, thereby improving the performance of the FinFET. Furthermore, the first carbon-doped epitaxial layer is in direct contact with the source/drain regions, the second epitaxial layer is a metal barrier layer, and the third epitaxial layer is a metal layer so that the original silicon crystal structure is destroyed, so that multiple facets will not occur during the growth of the epitaxial layers, and a rectangular profile will not generated, and the width of the lateral growth of the epitaxial layers is relatively small, so that adjacent epitaxial layers will not come together. Thus, the problems of the fusion of adjacent epitaxial layers of conventional techniques can be avoided. According to embodiments of the present invention, even if the pitch of adjacent epitaxial layers is very small and adjacent epitaxial layers fuse together, due to the presence of the metal barrier layer and the metal layer, the stress exercised onto the source/drain regions is strong and provide better effects than the structure of the prior art. In addition, due to the low concentration of the carbon content in the first epitaxial layer, it also facilitates a good integration of the epitaxial layers with the fin structure.

Figure 1:
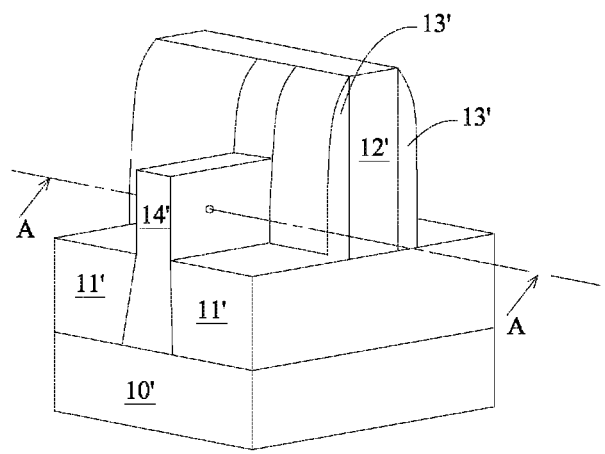
FIG. 1 is a perspective view of a semiconductor fin-FET device for illustrative purposes.

FIG. 1 is a perspective view of a FinFET structure that can be used for describing embodiments of the present invention. Referring to FIG. 1, a fin structure 14' protrudes from the surface of semiconductor substrate 10'. Fin structure 14' may be formed by etching semiconductor substrate 10'. Of course, fin structure 14' can also be formed by epitaxial growth of semiconductor substrate 10'. The FinFET structure also includes a dielectric layer 11' disposed on substrate 10' and a portion of the side surfaces of fin structure 14', and a gate structure disposed across fin structure 14'. The gate structure includes a gate electrode 12' and spacers 13' disposed on opposite sides of gate electrode 12'. Semiconductor substrate 10' may be a silicon substrate and doped with p-type or n-type impurity (dopant). In the exemplary embodiment, semiconductor substrate 10' is doped with n-type impurity, such as P, As or Sb. Generally, any dopant in the group V (i.e., N type) can be used in the exemplary embodiment. Dielectric layer 11' may be a shallow trench isolation (STI) region comprising a silicon oxide material, a silicon nitride material, a low-k dielectric constant material, or a combination thereof. The low-k dielectric constant material may be a fluorinated silicon glass (FSG), a carbon-doped silicon oxide, black diamond, xerogels, aerogels, and the like. Dielectric layer 11' may be formed by chemical vapor deposition or high-density plasma chemical vapor deposition. Source and drain regions in the fins are generally formed by an ion implantation process. In an embodiment, boron trifluoride ($BF_3$) can be a source of boron-containing dopant for implanting ions into the fin structure at an angle between 0 and 15 degrees, the implantation dose can be $2E''$ to $3E^{15}/cm^3$, the implantation energy may be 1.0 keV to 5.0 keV.

FIGS. 5 through 9 are cross-sectional views of intermediate stages of method 400 of FIG. 4 for manufacturing a FinFET device according to an embodiment of the present invention. The processes of method 400 is described together with FIGS. 5 through 9 below.

At S101, a fin structure is formed on a semiconductor substrate, and a dielectric layer is formed on the semiconductor substrate, and a gate structure is formed on the dielectric layer.

Figure 5:
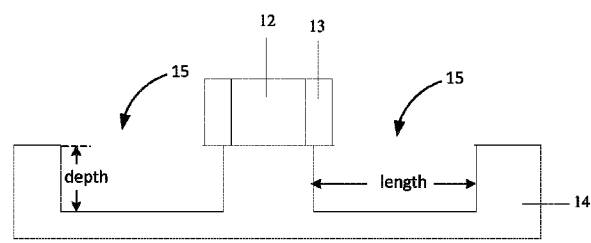
FIG. 5 is a cross-sectional view illustrating a trench formed in the source and drain regions of the fin structure along the transverse (horizontal) direction line A-A', in accordance with an embodiment of the present invention.

At S102, the source and drain regions are etched to form a trench in a portion the source and drain regions. FIG. 5 is a cross-sectional view illustrating a trench formed in a portion the source and drain regions of the fin structure along the transverse (horizontal) direction line A-A', in accordance with an embodiment of the present invention. In an embodiment, a trench 15 is formed in a portion of the source and drain regions on opposite sides of the gate structure by dry etching while other portions of the source and drain regions remain intact (e.g., the distal ends and the middle portion of the fin 14). Dry etching may include an etching gas $HBr/Cl_2/O_2/He$, at a pressure in the range between 1 mT and 1000 mT, a power in the range between 50 W and 1000 W, a bias voltage in the range between 100 V and 500 V, the Hbr gas flow rate in the range between 10 sccm and 500 sccm, the $Cl_2$ gas flow rate in the range between 0 sccm and 500 sccm, the $O_2$ gas flow rate in the range between 0 sccm and 100 sccm, and the He flow rate in the range between 0 sccm and 1000 sccm. Those skilled in the art shall appreciate that the trench 15 can be adjusted in depth and in length extending in the transverse direction according to the size of the fin structure. In a specific embodiment, the trench has a sufficient depth extending into the fin structure, e.g., in the range between 45 nm and 55 nm, preferably between 48 and 52 nm, and more preferably about 50 nm. The trench has a length extending in the horizontal direction of the fin structure. In an embodiment, the length of the trench is in the range between 20 nm and 30 nm, preferably in the range between 22 nm and 26 nm, and more preferable 25 nm.

Figure 6:
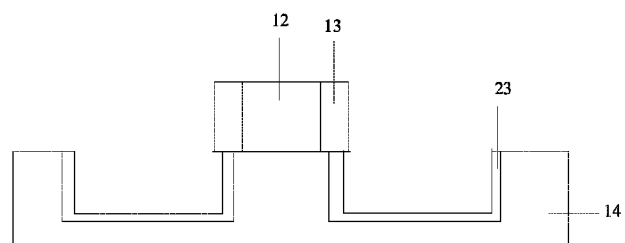
FIG. 6 is a cross-sectional view illustrating a first epitaxial layer deposited in the trench in the source and drain regions of FIG. 5.

At S103, a first epitaxial layer is deposited in trench 15. The first epitaxial layer is a carbon-doped silicon layer having a carbon concentration of less than 4 percent in weight. FIG. 6 is a cross-sectional view illustrating a first epitaxial layer 23 deposited in the trench 15 of FIG. 5. In an embodiment, first epitaxial layer 23 is a carbon-doped silicon layer having a carbon concentration less than 4 percent by weight. First epitaxial layer may be formed using a chemical vapor deposition process by adjusting the silicon-containing gas and the carbon-containing gas to obtain the desired carbon concentration. In another embodiment, first epitaxial layer 23 may also be formed as a silicon layer using a chemical vapor deposition process, and thereafter implanting carbon into the silicon layer. First epitaxial layer 23 is relatively thin and has a thickness in the range between 0 nm to 5 nm, preferably about 3 nm. During formation of first epitaxial layer 23, an etching gas such as HCl gas can be added to the silicon-containing gas and the carbon-containing gas so that first epitaxial layer 23 is selectively grown on fin structure 14 but does not grow on dielectric layer 11 and on the gate structure.

In an embodiment, the epitaxial growth process may be performed at a temperature in the range between 250 degrees C. and 1000 degrees C. The temperature may be determined according to the actual process conditions. The process chamber is generally maintained at a pressure in the range between 0.1 Torr and 200 Torr. The pressure of the process chamber is typically unchanged, but may fluctuate during the epitaxial growth.

The deposition gas contains at least a silicon gas, a carrier gas, and a carbon source. In an embodiment, the deposition gas may include at least one etchant, such as hydrogen chloride or chlorine.

The flow rate of the silicon gas is in the range between 5 sccm and 500 sccm, preferably in the range between 10 sccm and 300 sccm, and more preferably about 100 sccm. The silicon gas of the silicon and carbon containing deposition gas may include, but not limited to, silane, halogenated silane, and organosilane. A silane may include a monosilane and a higher order silane having a chemical formula of $Si_xH_{(2x+2)}$, such as disilane, trisilane, and butoxy silane. A halogenated silane may include a chemical formula of $X'_ySi_xH_{(2x+2-y)}$, where $X'$=F, Cl, Br, or I, such as hexachloro-disilane, tetrachlorosilane, trichlorosilane, and dichlorosilane. An organic silane compound may include a chemical formula of $R_ySi_xH_{(2x+2-y)}$, where R=methyl, ethyl, propyl, or butyl, such as methylsilane, dimethylsilane, triethylsilane, ethyl methyl silane, dimethyl acetamide, and hexamethyldisilane.

The silicon source is usually transported to the process chamber together with a carrier gas, the flow rate of the carrier gas is in the range between 1 slm and 100 slm, preferably between 5 slm and 75 slm, and more preferably between 10 slm and 50 slm, and more preferably about 25 slm. The carrier gas may include nitrogen, hydrogen, argon, helium, and a combination thereof. The carrier gas may be selected based on a precursor and/or process temperature used during the epitaxial growth process.

The carbon source supplied together with the silicon gas and the carrier gas to the process chamber to form the carbon-doped silicon material has a flow rate in the range between 0.5 sccm and 10 sccm, preferably between 1 sccm and 5 sccm, more preferably about 2 sccm. The carbon source for forming the carbon-doped silicon layer may include, but not limited to, organosilane, alkyl, alkene, ethyl, propyl, and butyl alkyne. The carbon source may include methylsilane, dimethylsilane, triethylsilane, methane, ethylene, acetylene, propane, propylene, acetylene, and other.

Figure 7:
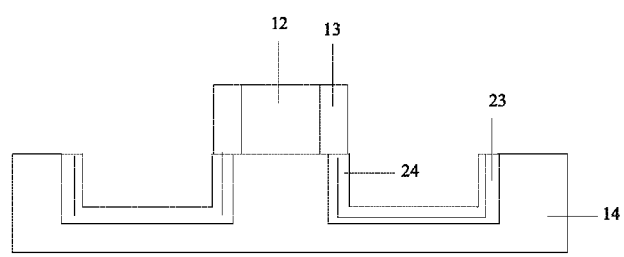
FIG. 7 is a cross-sectional view illustrating a second epitaxial layer deposited on the first epitaxial layer of FIG. 6.

At S104, a second epitaxial layer 24 is deposited on first epitaxial layer 23. Second epitaxial layer 24 is a barrier metal layer. FIG. 7 is a cross-sectional view illustrating a second epitaxial layer 24 deposited on first epitaxial layer 23 of FIG. 6. Second epitaxial layer 24 is a barrier metal layer formed by chemical vapor deposition or atomic layer deposition. The barrier metal layer may be formed of a metal nitride, which comprises tungsten nitride, tantalum nitride, aluminum nitride. In a specific embodiment, second epitaxial layer 24 includes tungsten nitride. During formation of second epitaxial layer 24, an etching gas of HCl may be added so that second epitaxial layer 24 is selectively grown on first epitaxial layer 23 but not on the gate structure and on dielectric layer 11.

In some embodiments, the tungsten nitride layer is formed by a chemical vapor deposition process. The chemical vapor deposition process includes a precursor gas comprising tungsten hexafluoride ($WF_6$), hydrogen ($H_2$), nitrogen ($N_2$), the chemical reaction may be carried out as follows:

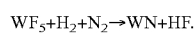

The flow rate of $WF_6$ is in the range between 3 sccm and 10 sccm, the flow rate of $N_2$ is in the range between 50 sccm and 200 sccm, where the flow rate of $N_2$ at the initial stage is greater than the $N_2$ flow rate at the end of the reaction. In the embodiment, the N$_2$ flow rate decreases linearly. The flow rate of H$_2$ is in the range between 100 sccm and 1000 sccm. In the embodiment, the precursor gas also includes argon (Ar) having a flow rate in the range between 300 sccm and 1000 sccm. The pressure of the reaction chamber is in the range between 3 Torr and 5 Torr, the RF power is in the range between 200 W and 500 W, the temperature of the reaction chamber is in the range between 400 and 500 degrees C., the reaction time period is in the range between 5 seconds and 15 seconds. In some other embodiments, the precursor gas may include WF$_6$ and NF$_3$. Second epitaxial layer 24 is relatively thin and has a thickness in the range between 0 and 3 nm, preferably about 2 nm.

Figure 8:
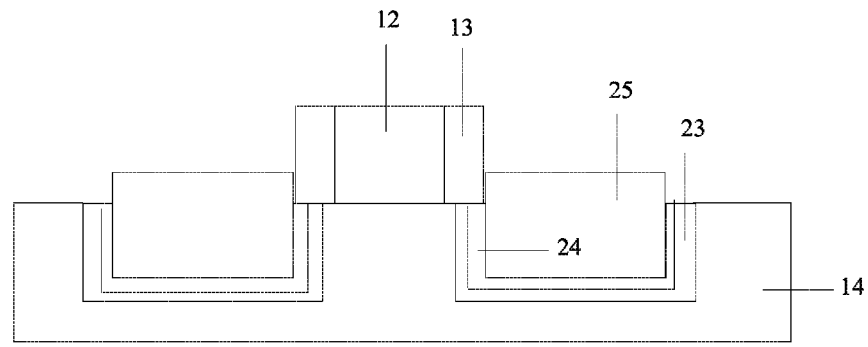
FIG. 8 is a cross-sectional view illustrating a third epitaxial layer deposited on the second epitaxial layer of FIG. 7.

At S105, a third epitaxial layer 25 is deposited on second epitaxial layer 24. Third epitaxial layer 25 is a metal layer. FIG. 8 is a cross-sectional view illustrating a third epitaxial layer 25 deposited on second epitaxial layer 24 of FIG. 7. Third epitaxial layer 25 is a metal layer formed by chemical vapor deposition or atomic layer deposition. The metal layer may be formed of tungsten, aluminum, or copper. In a specific embodiment, the metal layer includes tungsten. Third epitaxial layer 25 is relatively thick and has a thickness in the range between 45 nm and 55 nm, preferably about 50 nm. During formation of third epitaxial layer 25, an etching gas of HCl may be added so that third epitaxial layer 25 is selectively grown on second epitaxial layer 24 but not on the gate structure and on dielectric layer 11.

Figure 9:
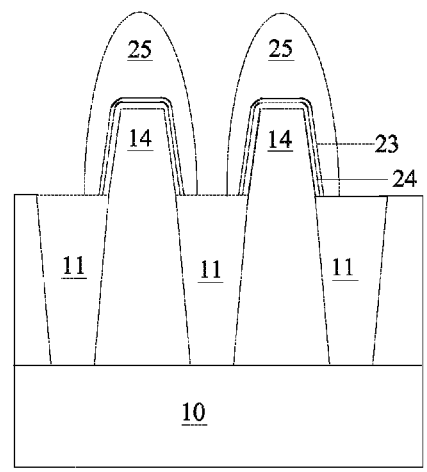
FIG. 9 is a cross-sectional view of the fin structure of FIG. 8 along the vertical direction at the position of the line A-A'.

Through the processes S101 through S105, a fin field effect transistor can be obtained having an epitaxial layer on the fin structure, the epitaxial layer has an outer surface that has a nearly oval profile. FIG. 9 is a cross-sectional view of the fin structure of FIG. 8 along the vertical direction at the position of the line A-A'. The epitaxial layer is a structure comprising a first epitaxial layer being a carbon-doped silicon layer with a carbon concentration of less than 4 percent by weight, a second epitaxial layer being a metal barrier layer, and a third epitaxial layer being a metal layer. Because the fin structure has a trench in the source and drain regions that is in direct contact with the first epitaxial layer having a relatively low carbon concentration, and because the second epitaxial layer disposed on the first epitaxial layer is a barrier metal layer, and a metal layer is disposed on the barrier metal layer, so that the epitaxial layer growth process will not form multiple facets, as shown in FIG. 9. Moreover, the epitaxial layer has an oval (egg-shaped) shape, so that the lateral growth of the epitaxial layer is reduced and adjacent epitaxial layers will not merge (fuse) together, thereby overcoming the problems that arise with the fusing together of adjacent epitaxial layers in the prior art.

Figure 2:
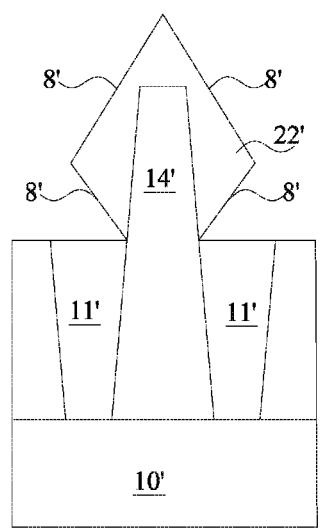
FIG. 2 is a cross-sectional view of an epitaxial layer grown from a semiconductor fin along the vertical direction of the line A-A' of FIG. 1.
Figure 3:
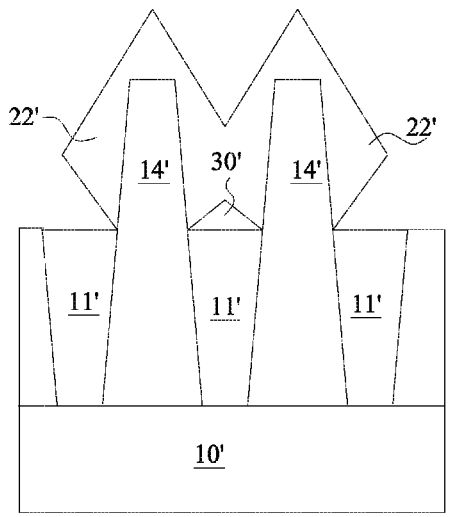
FIG. 3 is a cross-sectional view of an epitaxial layer merged together from neighboring semiconductor fins.

According to embodiments of the present invention, the epitaxial layer is a multi-layered stack comprising a first epitaxial layer being a carbon-doped silicon layer with a carbon concentration of less than 4 percent by weight, a second epitaxial layer being a metal barrier layer, and a third epitaxial layer being a metal layer. Because the fin structure has a trench in a portion of the source and drain regions that is in direct contact with the first epitaxial layer having a relatively low carbon concentration, and because the second epitaxial layer disposed on the first epitaxial layer is a barrier metal layer, and a metal layer is disposed on the barrier metal layer, so that the epitaxial layer growth process will not form multiple facets having lateral corners as in the prior art. Lateral corners formed from facets may reduce the air gap (distance) between adjacent epitaxial layers resulting in the growing together of the adjacent epitaxial layers and formation of voids in the prior art, as shown in FIGS. 2 and 3.

The foregoing description has provided by way of exemplary and non-limiting examples a full description of the invention. However, various modifications and adaptations may become apparent to those skilled in the art in view of the foregoing description, when read in conjunction with the accompanying drawings and the appended claims. Thus, such and similar modifications of the teachings of the invention will fall within the scope of this invention.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method of manufacturing a fin-type field effect transistor, the method comprising:
   providing a substrate having a fin;
   forming a gate structure on the fin;
   forming source and drain regions adjacent to the gate structure;
   etching a portion of the source and drain regions to form a trench;
   forming a first epitaxial layer in the trench, the first epitaxial layer being a carbon-doped silicon layer having a carbon concentration of less than 4 percent by weight;
   forming a second epitaxial layer on the first epitaxial layer, the second epitaxial layer being a barrier metal layer; and
   forming a third epitaxial layer on the second epitaxial layer, the third epitaxial layer being a metal layer.

2. The method of claim 1, wherein the first epitaxial layer has a thickness in a range between 0 nm and 5 nm.

3. The method of claim 1, wherein the second epitaxial layer has a thickness in a range between 0 nm and 3 nm.

4. The method of claim 1, wherein the third epitaxial layer has a thickness in a range between 45 nm and 55 nm.

5. The method of claim 1, wherein the barrier metal layer comprises a metal nitride material composed of tungsten nitride.

6. The method of claim 5, wherein the barrier metal layer is formed by chemical vapor deposition or atomic layer deposition using WF6 and NF3 precursors.

7. The method of claim 1, wherein the metal layer comprises a tungsten material.

8. The method of claim 1, wherein the trench has a depth in a range between 45 nm and 55 nm.

9. The method of claim 1, wherein the trench has a length extending in a horizontal direction relative to a surface of the fin in a range between 20 nm and 30 nm.

10. A fin-type field effect transistor (FinFET) device comprising:
    a substrate;
    a gate dielectric layer on the substrate;
    a fin on the gate dielectric layer, the fin having a middle section and source and drain regions at opposite ends;
    a trench in a portion of the source and drain regions;
    a gate structure on the middle section of the fin; and
    an epitaxial layer comprising:
      a first epitaxial layer in the trench, the first epitaxial layer being a carbon-doped silicon layer having a carbon dopant concentration of less than 4 percent by weight;
      a second epitaxial layer on the first epitaxial layer, the second epitaxial layer being a barrier metal layer; and
      a third epitaxial layer on the second epitaxial layer, the third epitaxial layer being a metal layer.

11. The FinFET device of claim 10, wherein the first epitaxial layer has a thickness in a range between 0 nm and 5 nm.

12. The FinFET device of claim 10, wherein the second epitaxial layer has a thickness in a range between 0 nm and 3 nm.

13. The FinFET device of claim 10, wherein the third epitaxial layer has a thickness in a range between 45 nm and 55 nm.

14. The FinFET device of claim 10, wherein the barrier metal layer comprises a metal nitride material composed of tungsten nitride.

15. The FinFET device of claim 10, wherein the metal layer comprises a tungsten material.

16. The FinFET device of claim 10, wherein the trench has a depth in a range between 45 nm and 55 nm.

17. The FinFET device of claim 10, wherein the trench has a length extending in a horizontal direction relative to a surface of the fin in a range between 20 nm and 30 nm.

* * * * *